United States Patent
Yang et al.

(10) Patent No.: US 11,765,862 B2
(45) Date of Patent: Sep. 19, 2023

(54) THERMAL MANAGEMENT SYSTEM FOR ELECTRONIC COMPONENTS WITH THERMOELECTRIC ELEMENT

(71) Applicant: Baidu USA LLC, Sunnyvale, CA (US)

(72) Inventors: Huawei Yang, Sunnyvale, CA (US); Tianyi Gao, Sunnyvale, CA (US); Shuai Shao, Sunnyvale, CA (US)

(73) Assignee: BAIDU USA LLC, Sunnyvale, CA (US)

( * ) Notice: Subject to any disclaimer, the term of this patent is extended or adjusted under 35 U.S.C. 154(b) by 0 days.

(21) Appl. No.: 17/037,299

(22) Filed: Sep. 29, 2020

(65) Prior Publication Data
US 2022/0104387 A1    Mar. 31, 2022

(51) Int. Cl.
| | |
|---|---|
| *H05K 7/20* | (2006.01) |
| *H01L 23/38* | (2006.01) |
| *H01L 23/34* | (2006.01) |
| *F25B 21/04* | (2006.01) |
| *H02M 3/158* | (2006.01) |
| *H02M 1/00* | (2006.01) |

(52) U.S. Cl.
CPC ........... *H05K 7/2039* (2013.01); *F25B 21/04* (2013.01); *H01L 23/345* (2013.01); *H01L 23/38* (2013.01); *H02M 1/0077* (2021.05); *H02M 3/1582* (2013.01)

(58) Field of Classification Search
CPC ........ H01L 23/345; H01L 23/38; F25B 21/04; H02M 3/1582; H02M 1/0077
See application file for complete search history.

(56) References Cited

U.S. PATENT DOCUMENTS 4,301,658 A * 11/1981 Reed ................ F25B 21/04
165/253
4,631,728 A * 12/1986 Simons ............ H01S 5/02415
372/34

(Continued)

FOREIGN PATENT DOCUMENTS

CN      203562639 U  *  4/2014
CN      104767169 A  *  7/2015
(Continued)

OTHER PUBLICATIONS

Diodes Incorporated, 30V Complementary Enhancement Mode MOSFET H-Bridge, Data Sheet DMHC3025LSD, Document No. DS35821 Rev. 5-2, Jan. 2018 (Year: 2018).*

*Primary Examiner* — Robert J Hoffberg
(74) *Attorney, Agent, or Firm* — WOMBLE BOND DICKINSON (US) LLP (57) ABSTRACT

A cooling and heating system for an electronic component comprises a thermoelectric element disposed near the electronic component and an electrical circuit for a bidirectional current, where the thermoelectric element is connected to the electrical circuit for the bidirectional current. The cooling and heating system further comprises a controller configured to control a current flow direction of the bidirectional current in the thermoelectric element to cool or heat the electronic component, where whether the electronic component is to be cooled or heated is based on the current flow direction of the bidirectional current in the thermoelectric element.

19 Claims, 7 Drawing Sheets

(56) References Cited

U.S. PATENT DOCUMENTS

| | | | | |
|---|---|---|---|---|
| 4,736,151 A * | 4/1988 | Dishner | H02M 3/1582 | 323/224 |
| 5,655,375 A * | 8/1997 | Ju | F25B 21/04 | 361/695 |
| 5,687,070 A * | 11/1997 | Jacobs | H02M 1/4225 | 363/126 |
| 5,890,371 A * | 4/1999 | Rajasubramanian | F24F 5/0042 | 62/332 |
| 6,094,919 A * | 8/2000 | Bhatia | H01L 23/38 | 62/3.2 |
| 6,232,752 B1 * | 5/2001 | Bissell | H02M 3/1582 | 323/225 |
| 6,253,556 B1 * | 7/2001 | Schendel | F25B 21/04 | 257/E23.081 |
| 6,424,533 B1 * | 7/2002 | Chu | H01L 23/433 | 361/719 |
| 6,621,236 B1 * | 9/2003 | Kisaichi | H05B 41/2886 | 315/246 |
| 6,679,064 B2 * | 1/2004 | Chang | H01L 35/32 | 136/201 |
| 6,804,966 B1 * | 10/2004 | Chu | F25B 21/02 | 361/688 |
| 7,324,354 B2 * | 1/2008 | Joshi | H02M 3/1588 | 363/61 |
| 7,775,706 B1 * | 8/2010 | Feller | G01K 17/10 | 374/29 |
| 7,964,951 B2 * | 6/2011 | Refai-Ahmed | H01L 23/10 | 257/777 |
| 8,866,454 B2 * | 10/2014 | Nair | H02M 3/1582 | 323/271 |
| 8,901,861 B2 * | 12/2014 | Luke | B60L 3/003 | 318/370 |
| 9,236,639 B2 * | 1/2016 | Yang | H01M 10/615 | |
| 9,370,123 B2 * | 6/2016 | Blumenthal | H05K 7/20336 | |
| 9,577,529 B2 * | 2/2017 | Stanzione | H02M 3/156 | |
| 9,661,697 B2 * | 5/2017 | Sadwick | H05B 45/18 | |
| 9,746,889 B2 * | 8/2017 | Mittal | H10N 19/00 | |
| 9,817,346 B2 * | 11/2017 | Saiki | G03G 15/2053 | |
| 9,882,646 B2 * | 1/2018 | Blumenthal | H01S 5/02469 | |
| 10,193,371 B2 * | 1/2019 | Chiang | H02J 7/0091 | |
| 10,211,719 B2 * | 2/2019 | Tanaka | H02M 3/33523 | |
| 10,845,375 B2 * | 11/2020 | Sommer | H01L 37/00 | |
| 11,424,679 B2 * | 8/2022 | Mohanaveeramani | H02M 3/1582 | |
| 2002/0121094 A1 * | 9/2002 | VanHoudt | H01S 5/02415 | 62/3.3 |
| 2006/0086096 A1 * | 4/2006 | Ghoshal | H01L 31/024 | 62/3.2 |
| 2006/0088271 A1 * | 4/2006 | Ghoshal | H01L 31/024 | 257/E31.131 |
| 2015/0059358 A1 * | 3/2015 | Chang | F25B 21/02 | 62/3.2 |
| 2016/0150683 A1 * | 5/2016 | Sagerian | H05K 7/20963 | 62/3.3 |
| 2017/0242048 A1 * | 8/2017 | Sommer | F25B 21/02 | |
| 2022/0166341 A1 * | 5/2022 | Afridi | H01G 4/38 | |

FOREIGN PATENT DOCUMENTS

| | | | |
|---|---|---|---|
| CN | 106026728 A | * | 10/2016 |
| CN | 108494249 A | * | 9/2018 |
| CN | 212969611 U | * | 4/2021 |

* cited by examiner

THERMAL MANAGEMENT SYSTEM FOR ELECTRONIC COMPONENTS WITH THERMOELECTRIC ELEMENT

FIELD OF THE INVENTION

Embodiments of the present disclosure relate generally to thermal management for electronic components. More particularly, embodiments of the disclosure relate to a cooling and heating system for an electronic component with a thermoelectric element.

BACKGROUND

Thermal management is important in a computer system and data center design. Electronic components may require cooling operation and/or heating operation under different working conditions. For example, when an ambient temperature is below a required working temperature, the electronic components may need to be heated to reach the required working temperature; while in some conditions, the electronic components may need to be cooled due to an amount of heat generated and dissipated during operations of the electronic components.

Two different setups are usually involved in a conventional thermal management system for electronic components that require both the heating and cooling operations. One set up may be used for cooling the electronic components, which may be based on air, liquid, or immersion cooling. The other setup may be used for heating the electronic components, in which heat may be transferred to the electronic components from an external heat source. However, the two different setups in the conventional system may result in high cost, high complexity, and overcrowded space. Further, the conventional system may have a low efficiency, especially for the heating operation.

BRIEF DESCRIPTION OF THE DRAWINGS

Embodiments of the disclosure are illustrated by way of example and not limitation in the figures of the accompanying drawings in which like references indicate similar elements.

DETAILED DESCRIPTION

Various embodiments and aspects of the disclosure will be described with reference to details discussed below, and the accompanying drawings will illustrate the various embodiments. The following description and drawings are illustrative of the disclosure and are not to be construed as limiting the disclosure. Numerous specific details are described to provide a thorough understanding of various embodiments of the present disclosure. However, in certain instances, well-known or conventional details are not described in order to provide a concise discussion of embodiments of the present disclosures.

Reference in the specification to "one embodiment" or "an embodiment" means that a particular feature, structure, or characteristic described in conjunction with the embodiment can be included in at least one embodiment of the disclosure. The appearances of the phrase "in one embodiment" in various places in the specification do not necessarily all refer to the same embodiment.

In some embodiments, a cooling and heating system for an electronic component is disclosed. Cooling and heating operations may be realized through a thermoelectric element with a bidirectional current flow. By controlling a current flow direction, the electronic component may either be cooled or heated without an external heat source, even when active heating may be required. The system may enable a self-regulated heat transfer. Both a hot side temperature and a code side temperature may be sensed and the current flow direction may be automatically controlled to enable either cooling or heating. In this way, the cooling and heating system may achieve a self-sensing and self-regulating to perform different heat transfer modes within one system. Therefore, a complexity of the system may be reduced and an efficiency of the system may be improved.

According to some embodiments, a cooling and heating system for an electronic component comprises a thermoelectric element disposed near the electronic component and an electrical circuit for a bidirectional current, where the thermoelectric element is connected to the electrical circuit for the bidirectional current. The cooling and heating system further comprises a controller configured to control a current flow direction of the bidirectional current in the thermoelectric element to cool or heat the electronic component, where whether the electronic component is to be cooled or heated is based on the current flow direction of the bidirectional current in the thermoelectric element.

In one embodiment, the system may further comprise a cover of the electronic component, the cover including a package lid or a pad.

In one embodiment, the thermoelectric element is disposed on top of the cover or inside the cover.

In one embodiment, the system may further comprise a heat transferring element including a heatsink or a cold plate.

In one embodiment, the thermoelectric element is disposed between the cover and the heat transferring element, or inside the heat transferring element, or inside the cover.

In one embodiment, the electrical circuit for the bidirectional current includes a buck-boost converter and a polarity change circuit.

In one embodiment, the polarity change circuit is configured to change the current flow direction of the bidirectional current in the thermoelectric element.

In one embodiment, the self-regulated heat transfer controller is configured to measure a temperature of a first side of the thermoelectric element and a temperature of a second side of the thermoelectric element, and to determine the current flow direction of the bidirectional current in the thermoelectric element based on the temperature of the first side of the thermoelectric element and the temperature of the second side of the thermoelectric element.

In one embodiment, the self-regulated heat transfer controller is further configured to determine the current flow direction of the bidirectional current in the thermoelectric element based on a minimum temperature allowed for the electronic component.

In one embodiment, the self-regulated heat transfer controller is further configured to determine the current flow direction of the bidirectional current in the thermoelectric element based on a target temperature for the electronic component.

In one embodiment, the self-regulated heat transfer controller is configured to determine the current flow direction of the bidirectional current is to be in a direction to heat up the electronic component in response to determining that a temperature of a first side of the thermoelectric element is lower than a minimum temperature allowable for the electronic component.

In one embodiment, the self-regulated heat transfer controller is configured to determine the current flow direction of the bidirectional current is to be in a direction to cool the electronic component in response to determining that a temperature of a first side of the thermoelectric element is higher than a temperature of a second side of the thermoelectric element.

In one embodiment, the system includes a cooling mode to cool the electronic component and a heating mode to heat the electronic component, and wherein no extra component is needed when switching between the cooling mode and the heating mode.

According to some embodiments, a method for cooling and heating an electronic component is disclosed. The method includes activating a thermoelectric element disposed near an electronic component, where the thermoelectric element is connected to an electrical circuit for a bidirectional current. The method further includes controlling a current flow direction of the bidirectional current in the thermoelectric element to cool or heat the electronic component, where whether the electronic component is to be cooled or heated is based on the current flow direction of the bidirectional current in the thermoelectric element.

In one embodiment, the current flow direction of the bidirectional current in the thermoelectric element may be changed by a polarity change circuit.

In one embodiment, a temperature of a first side of the thermoelectric element and a temperature of a second side of the thermoelectric element may be measured, and the current flow direction of the bidirectional current in the thermoelectric element may be determined based on the temperature of the first side of the thermoelectric element and the temperature of the second side of the thermoelectric element.

In one embodiment, the current flow direction of the bidirectional current in the thermoelectric element may be further determined based on a minimum temperature allowed for the electronic component.

In one embodiment, the current flow direction of the bidirectional current in the thermoelectric element may be further determined based on a target temperature for the electronic component.

In one embodiment, the current flow direction of the bidirectional current may be determined to be in a direction to heat up the electronic component in response to determining that a temperature of a first side of the thermoelectric element is lower than a minimum temperature allowed for the electronic component.

In one embodiment, the current flow direction of the bidirectional current may be determined to be in a direction to cool the electronic component in response to determining that a temperature of a first side of the thermoelectric element is higher than a temperature of a second side of the thermoelectric element.

Disclosed herein is a cooling and heating system and method enabled by including a thermoelectric element (TEE) and a bidirectional electrical circuit. This system may be applied in heating and cooling electronic components, such as, chips and/or memory packages, capacitors and resistors, etc. The system may also be associated with a current flow control to enable a self-regulated heat transfer. For example, both a hot side temperature and a code side temperature may be sensed and the current flow direction may be automatically controlled to enable either cooling or heating the electronic components. The system is capable of both cooling and heating operations, no extra components or mechanism are needed when switching between a cooling mode and a heating mode.

Advantageously, the system including the TEE may enable an extreme low thermal resistance that traditional cooling systems, such as heatsinks or cold plates, may fail to deliver at a similar efficiency, volume, and cost. In addition, the bidirectional electrical circuit in the system may only include a single converter to realize a bidirectional current flow, which in turn reduces the cost and volume. The system may be suitable in applications where footprint is limited and compact design is desirable. The system may be used to heat up the electronic components as a heat pump without an external heat source, which makes the system helpful for outdoor applications. The system may be applied to electronic components that have a non-uniform heat gradient, where part of the components may generate much more heat than the other parts. Furthermore, the system is featured with the current flow control to enable the self-regulated heat transfer. Therefore, the system may have a reduced cost and volume and an improved efficiency.

Figure 1:
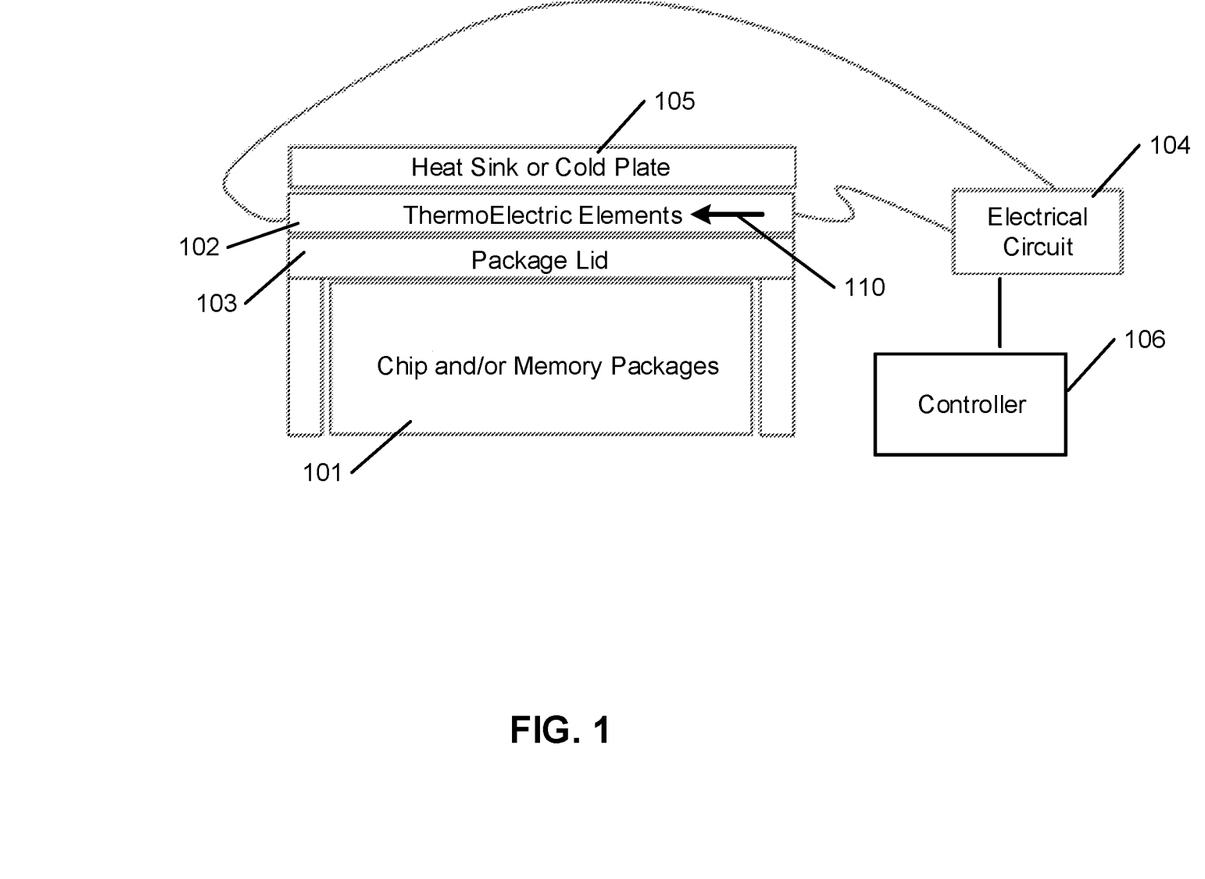
FIG. 1 is a block diagram illustrating an example of a cooling and heating system according to some embodiments.

FIG. 1 is a block diagram illustrating an example of a cooling and heating system 100 according to some embodiments. In this example, FIG. 1 shows a side view of the cooling and heating system 100 for an electronic component 101. The electronic component 101 may include, but not being limited to, an electronic chip, a memory package, capacitor, resistor, inductor, transistor, or any type of electronic component, etc. Referring to FIG. 1, the cooling and heating system 100 may comprise a thermoelectric element 102, a cover 103 for the electronic component, an electrical circuit 104 for a bidirectional current 110, and a controller 106. The thermoelectric element 102 may be disposed near the electronic component 101. The thermoelectric element 102 may be connected to the electrical circuit 104 for the bidirectional current 110, for example, the thermoelectric element 102 may be a load in the electrical circuit 104. The controller 106 may be a self-regulated heat transfer controller. The controller 106 may be configured to control a current flow direction of the bidirectional current 110 in the thermoelectric element 102 to cool or heat the electronic component 101, where whether the electronic component 101 is to be cooled or heated is based on the current flow direction of the bidirectional current 110 in the thermoelectric element 102.

As illustrated in FIG. 1, the thermoelectric element 102 may be disposed above the electronic component 101. The thermoelectric element 102 may be disposed around the component 101, or beneath the component 101. The cover 103 of the electronic component 101 may include a package lid for a chip or memory package, or a pad for capacitor, a resistor, etc. The thermoelectric element 102 may be disposed on top of the cover 103 or inside the cover 103. The thermoelectric element 102 may be disposed over a portion of the cover 103, or over the entire cover 103.

In one embodiment, the cooling and heating system 100 may further comprise a heat transferring element, which may include a heat sink or cold plate 105. In one embodiment, the thermoelectric element 102 may be disposed between the cover 103 and the heat sink or cold plate 105, as shown in FIG. 1. The electronic component 101 may be a chip or a memory package. The thermoelectric element 102 may lie between the package lid 103 and the heatsink or cold plate 105 with close attachments to both the package lid and the heatsink/cold plate. The thermoelectric element 102 itself may be connected to the external electrical circuit 104 for a current control purpose. In one embodiment, the thermoelectric element 102 may be disposed inside the heat sink or cold plate 105. In one embodiment, the thermoelectric element 102 may be disposed inside the cover 103.

The thermoelectric element (TEE) 102 may operate based on a peltier effect. When a current is flowing in the TEE 102 in a positive direction, the TEE 102 may be used for a cooling purpose, where heat is transferred from a side A to a side B of the TEE 102. When the current is flowing in the TEE 102 in a negative direction, the TEE 102 may be used for a heating purpose, where the heat is transferred from the side B to the side A of the TEE. However, there is a limitation on a maximum temperature difference between the two sides.

Figure 2:
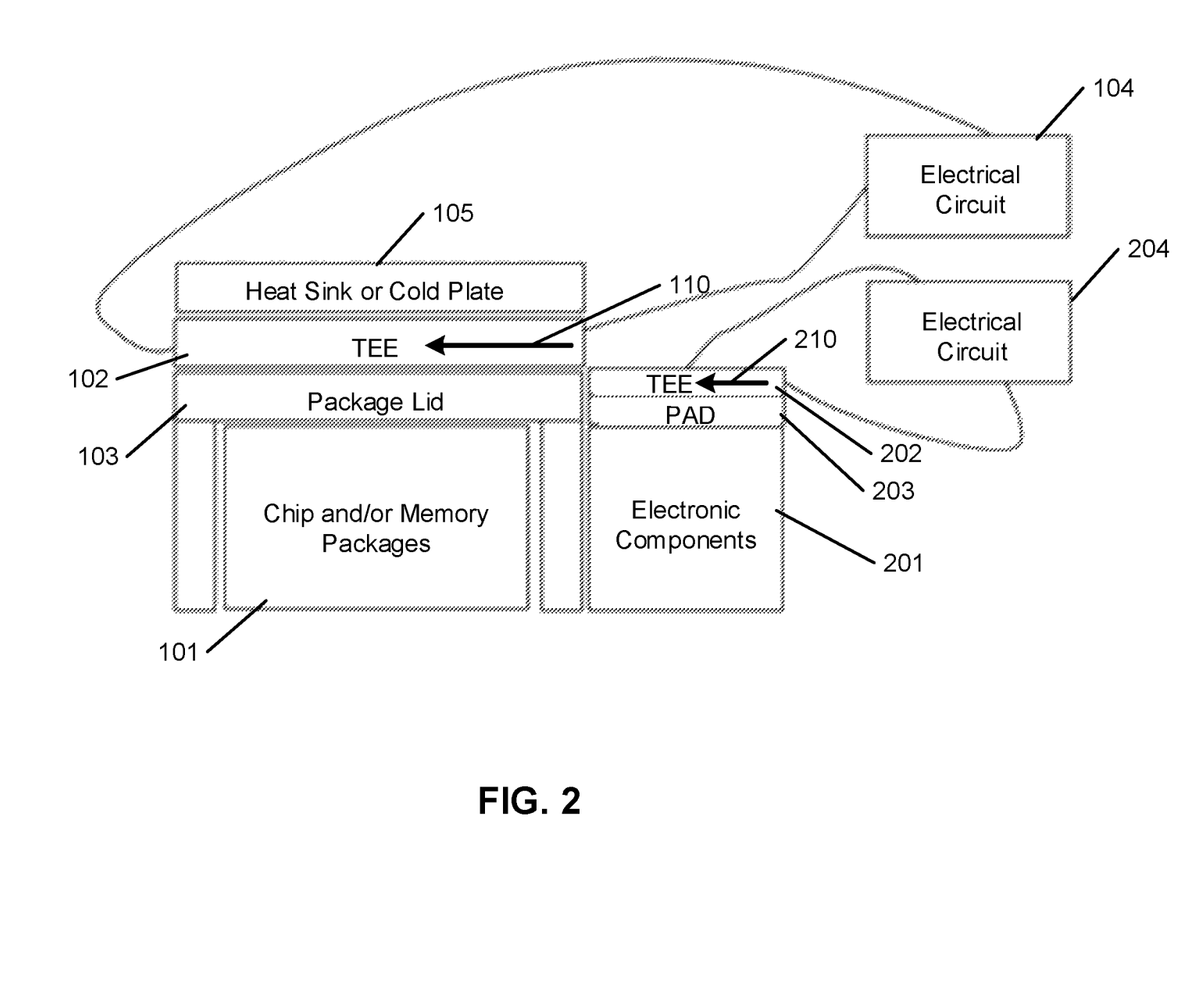
FIG. 2 is a block diagram illustrating an example of a cooling and heating system according to some embodiments.

FIG. 2 is a block diagram illustrating an example of a cooling and heating system 200 according to some embodiments. In this example, FIG. 2 shows a side view of the cooling and heating system 200. The cooling and heating system 200 may comprise the TEE 102, the cover 103 for the electronic component 101 (e.g., a chip or a memory package), the electrical circuit 104, and the controller 106 (not shown). The cooling and heating system 200 may further comprise a second TEE 202, a second cover 203 for a second electronic component 201, a second electrical circuit 204, and a second controller (not shown). For example, the second electronic component 201 may include other critical component such as a capacitor, a resistor, and/or other non-heavy computing units that may need a preheat or a low level cooling for outdoor applications, e.g., in edge computing and/or automotive applications. The second cover 203 may include a thermal pad which may be used for a heat transfer purpose. The second TEE 202 may be attached to the thermal pad 203 for heating or cooling purpose. The second controller may be configured to control a current flow direction of a bidirectional current 210 in the second TEE 202 to cool or heat the electronic component 201. In one embodiment, the controller and the second controller may be a same controller.

In one embodiment, a cooling and heating system may comprise a TEE, a thermal pad for an electronic component (e.g., capacitor, resistor, and/or other non-heavy computing unit), an electrical circuit for a bidirectional current, and a controller.

Figure 3:
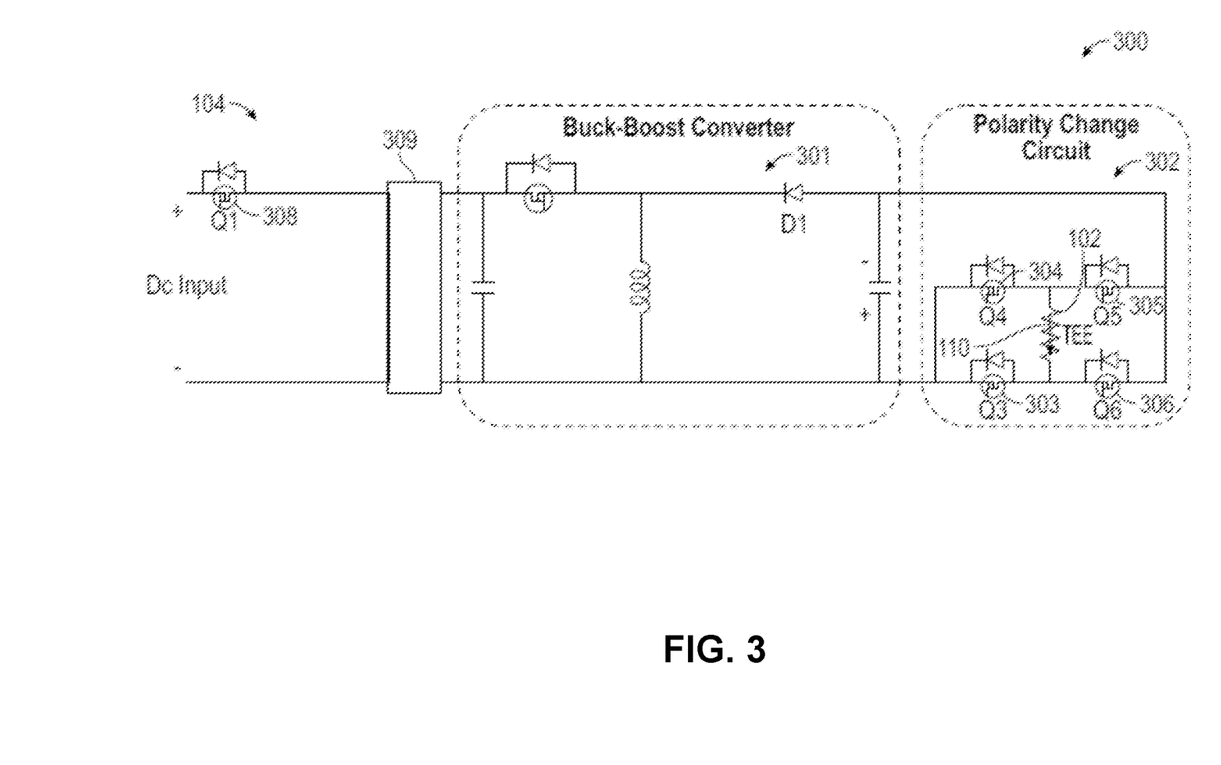
FIG. 3 is a block diagram illustrating an example of an electrical circuit of a cooling and heating system according to some embodiments.

FIG. 3 is a block diagram 300 illustrating an example of an electrical circuit of a cooling and heating system according to some embodiments. The electrical circuit may be the electrical circuit 104 in the cooling and heating system 100 in FIG. 1. The circuit 104 is configured for a bidirectional current flow control. The circuit 104 may include a buck-boost converter 301 and a polarity change circuit 302 (also referred to as polarity switching circuit).

As shown in FIG. 3, the buck-boost converter 301 (in the dotted circle) may be employed as a main power circuit. An output voltage is defined as below:

$$\frac{V_{out}}{V_{in}} = \frac{-D}{1-D}$$

D is a duty cycle. D ranges between 0 and 1 representing a percentage of time that a particular switch is turned on during a period of time or a cycle. By controlling the duty cycle D, the output voltage, $V_{out}$, can be either higher or lower than an input voltage, $V_{in}$. Thus, the convertor 301 may have a wide range of output voltage.

A switch Q1 308 may be added for safety. The controller (not shown) may sense the input voltage, and only if the input voltage is within an allowed range, the switch Q1 308 may be turned on. The switch Q1 308 may also serve as a soft start switch. In this example, switch 308 is implemented as a transistor such as a metal oxide silicon field effect transistor (MOSFET); otherwise, other types of switches may be implemented. In this example, the controller is coupled to a gate terminal of switch 308 to provide a control signal (e.g., pulse signal) with proper duty cycle to control the ON and OFF of switch 308.

An electromagnetic interference (EMI)/input filter 309 may be added as a block to filter out noises. The EMI/input filter 309 may be customized according to different DC input, switching frequency, etc.

Referring to FIG. 3, the polarity change circuit 302 is configured to change a current flow direction of the bidirectional current 110 in the TEE 102. A set of transistors Q3 303, Q4 304, Q5 305 and Q6 305 may come in as a group of switches to form the polarity change circuit 302. A polarity of the converter 301 output voltage may stay the same all the time, which may be negative compared to the input voltage. To change a polarity of an output current 110, these 4 switches 303, 304, 305, 306 are added. In this way, only one converter is needed instead of two, thereby saving a footprint and a total cost.

To have a negative current, which is a reverse polarity of the input voltage and current, the switch Q3 303 and the switch Q5 305 may be turned on while the switch Q4 304 and the switch Q6 306 may be turned off. Thus, a current may be flowing from the converter positive output to the switch Q3 303, then a load (the TEE 102), then the switch Q5 305, then back to the converter negative output (e.g., the node coupled to the anode of diode D1). The current flow direction of the bidirectional current 110 in the TEE 102 may be in a negative direction in this case.

To have a positive current, the switch Q4 304 and the switch Q6 306 may be turned on while the switch Q3 303 and the switch Q5 305 may be off. The current direction of the bidirectional current 110 in the TEE 102 may be reversed compared to the negative current setting. The current may be flowing from the converter positive output to the switch Q4 304, then the load (the TEE 102), then the switch Q6 306, then back to the converter negative output. The current flow direction of the bidirectional current 110 in the TEE 102 may be in a positive direction in this case.

In this example, MOSFETs (e.g., p-channel MOSFETs) are utilized as examples of switches for switching devices 303-306; however, other types of switching devices may also be utilized. The controller (not shown) is coupled to the gate terminals of the MOSGETs. The controller may be a programmable controller such as a field programmable gate array (FPGA) having a control algorithm programmed therein. The controller may control the switches' duty cycles based on the temperature data obtained from one or more temperature sensors coupled to the electronic components (e.g., processor) or coupled to different sides of TEE element 102. Based on the temperature, the control may turn on or off some of the switches to control the current flow direction of a current flowing through TEE 102, which enables the TEE 102 to operate in a cooling mode or a heating mode.

In one embodiment, polarity change circuit 302 includes a first switch (e.g., switch 303) coupled between a first output terminal (e.g., positive output terminal) of the converter 301 and a first terminal of the thermoelectric element (e.g., the terminal coupled to switches 303 and 306). The polarity change circuit further includes a second switch (e.g., switch 304) coupled between the first output terminal of the converter 301 and a second terminal of the thermoelectric element (e.g., the terminal coupled to switches 304 and 305). The polarity change circuit further includes a third switch (e.g., switch 305) coupled between a second output terminal (e.g., negative output terminal) of converter 301 and the second terminal of the thermoelectric element. The polarity change circuit further includes a fourth switch (e.g., switch 306) coupled between the second output terminal of the power source and the first terminal of the thermoelectric element. When the first switch and the third switch are turned on while the second switch and fourth switch are turned off, the current flow direction in a first direction, and wherein when the second switch and the fourth switch are turned on while the first switch and the third switch are turned off, the current flow direction is in a second direction opposite to the first direction.

Thermoelectric cooling uses the Peltier effect to create a heat flux at the junction of two different types of materials. A Peltier cooler, heater, or thermoelectric heat pump is a solid-state active heat pump which transfers heat from one side of the device to the other, with consumption of electrical energy, depending on the direction of the current. Such an instrument is also called a Peltier device, Peltier heat pump, solid state refrigerator, or thermoelectric cooler (TEC). It can be used either for heating or for cooling, although in practice the main application is cooling. It can also be used as a temperature controller that either heats or cools. Thus, by controlling the current flow direction of a current flowing through TEE 102, the TEE 102 is configured to provide cooling or heating to the electronic component.

Figure 4:
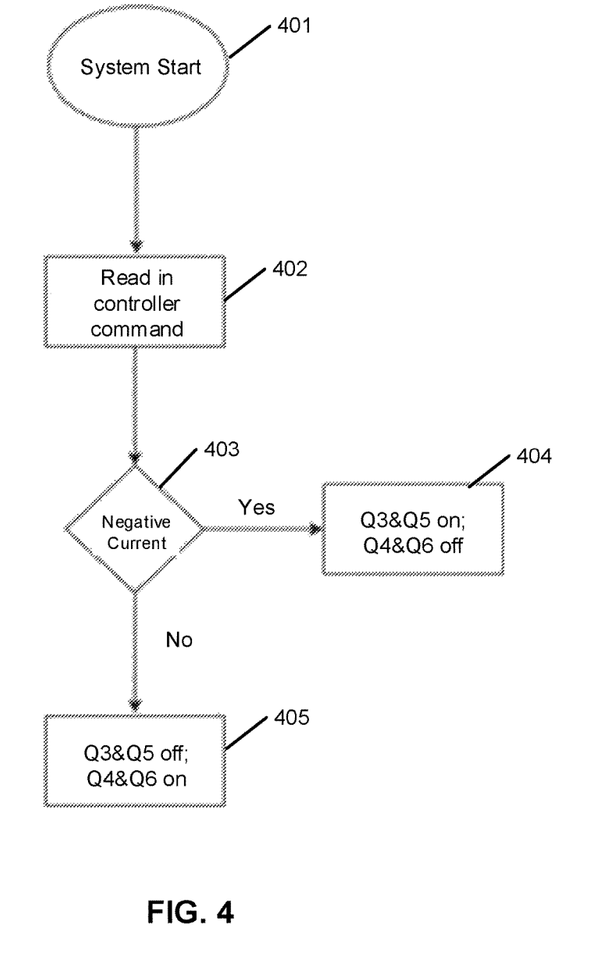
FIG. 4 is a flow diagram illustrating a control of a polarity change of an electrical circuit of a cooling and heating system according to some embodiments.

FIG. 4 is a flow diagram 400 illustrating a control of a polarity change of an electrical circuit of a cooling and heating system according to some embodiments. The electrical circuit may be the electrical circuit 104 in the cooling and heating system 100 in FIG. 1. As illustrated in FIG. 4, at 401, the system may be started.

At block 402, a command from a controller may be read in. The controller may be the controller 106 as illustrated in FIG. 1.

At block 403, it is determined whether a negative current is needed based on the command from the controller.

At block 404, in response to determining that the negative current is needed, the switch Q3 303 and the switch Q5 305 are turned on while the switch Q4 304 and the switch Q6 306 are turned off. Thus, a current flow direction of the bidirectional current 110 in the TEE 102 is in a negative direction.

At block 405, in response to determining that the negative current is not needed, the switch Q4 304 and the switch Q6 306 are turned on while the switch Q3 303 and the switch Q5 305 are turned off. Thus, a current flow direction of the bidirectional current 110 in the TEE 102 is in a positive direction.

Figure 5:
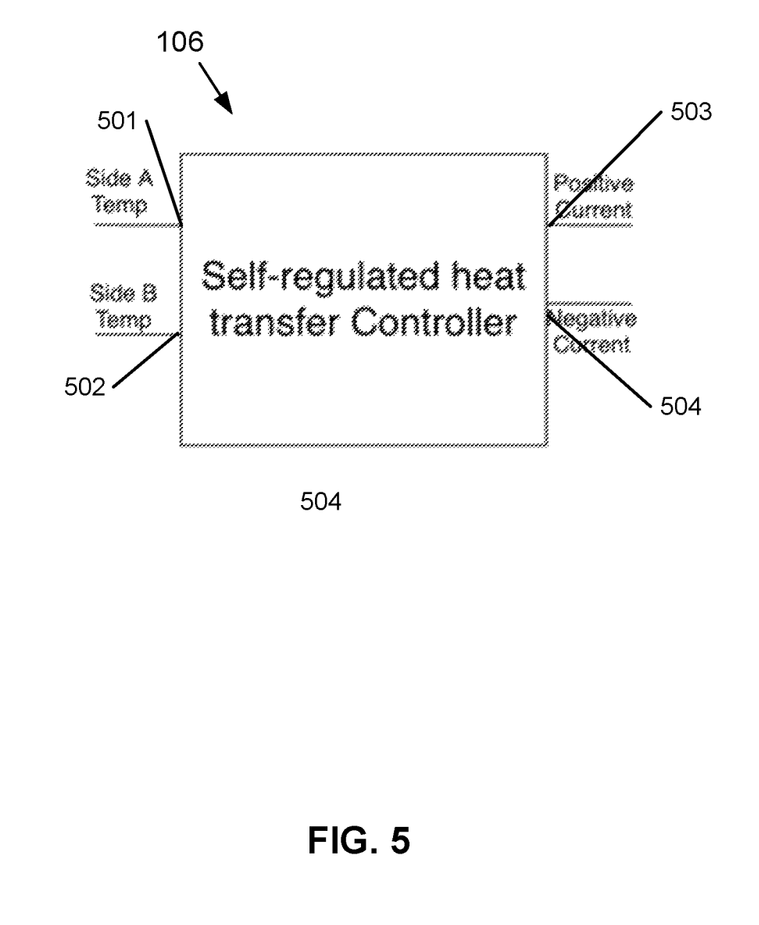
FIG. 5 is a block diagram illustrating an example of a controller of a cooling and heating system according to some embodiments.

FIG. 5 is a block diagram illustrating an example of a controller of a cooling and heating system according to some embodiments. The controller may be the controller 106 in the cooling and heating system 100 in FIG. 1. The controller 106 may be a self-regulated heat transfer controller. The cooling and heating system 100 may have two modes, a first cooling mode and a second heating mode. In one embodiment, the controller 106 may take a temperature of a first side (side A) of the TEE 102 and a temperature of a second side (side B) of the TEE 102, and a mode command as inputs. The first side (side A) may be a side of the TEE that is closer to the electronic component 101. The second side (side B) may be a side of the TEE that is closer to the environment or the heat sink/cold plate. The controller 106 may output a command for a current flow direction of the bidirectional current in the TEE.

In another embodiment, additional temperatures may be collected and used as inputs of the controller. The additional temperature measurements may be used together with the side A and side B temperatures as inputs for the controller.

As illustrated in FIG. 5, the self-regulated controller 106 may have at least two inputs 501, 502 and two outputs 503, 504. The two temperature inputs 501, 502 may be sensed from temperature sensors. For example, a first input 501 may receive the temperature of the first side (side A) of the TEE from a first sensor, and a second input 502 may receive the temperature of the second side (side B) of the TEE from a second sensor. Based on the temperatures of the first side (side A) and the second side (side B), the controller 106 may decide the current flow direction of the bidirectional current based on a logic shown in FIG. 6, which will be described below. This self-regulated controller may be embedded into a core controller.

In one embodiment, the self-regulated heat transfer controller 106 is configured to measure the temperature of the first side of the thermoelectric element and the temperature of the second side of the thermoelectric element, and to determine the current flow direction of the bidirectional current in the thermoelectric element based on the temperature of the first side of the thermoelectric element and the temperature of the second side of the thermoelectric element. The self-regulated heat transfer controller 106 may further determine the current flow direction of the bidirectional current in the thermoelectric element based on a mode of operating, where the mode of operating may include a first mode of cooling and a second mode of heating.

Figure 6:
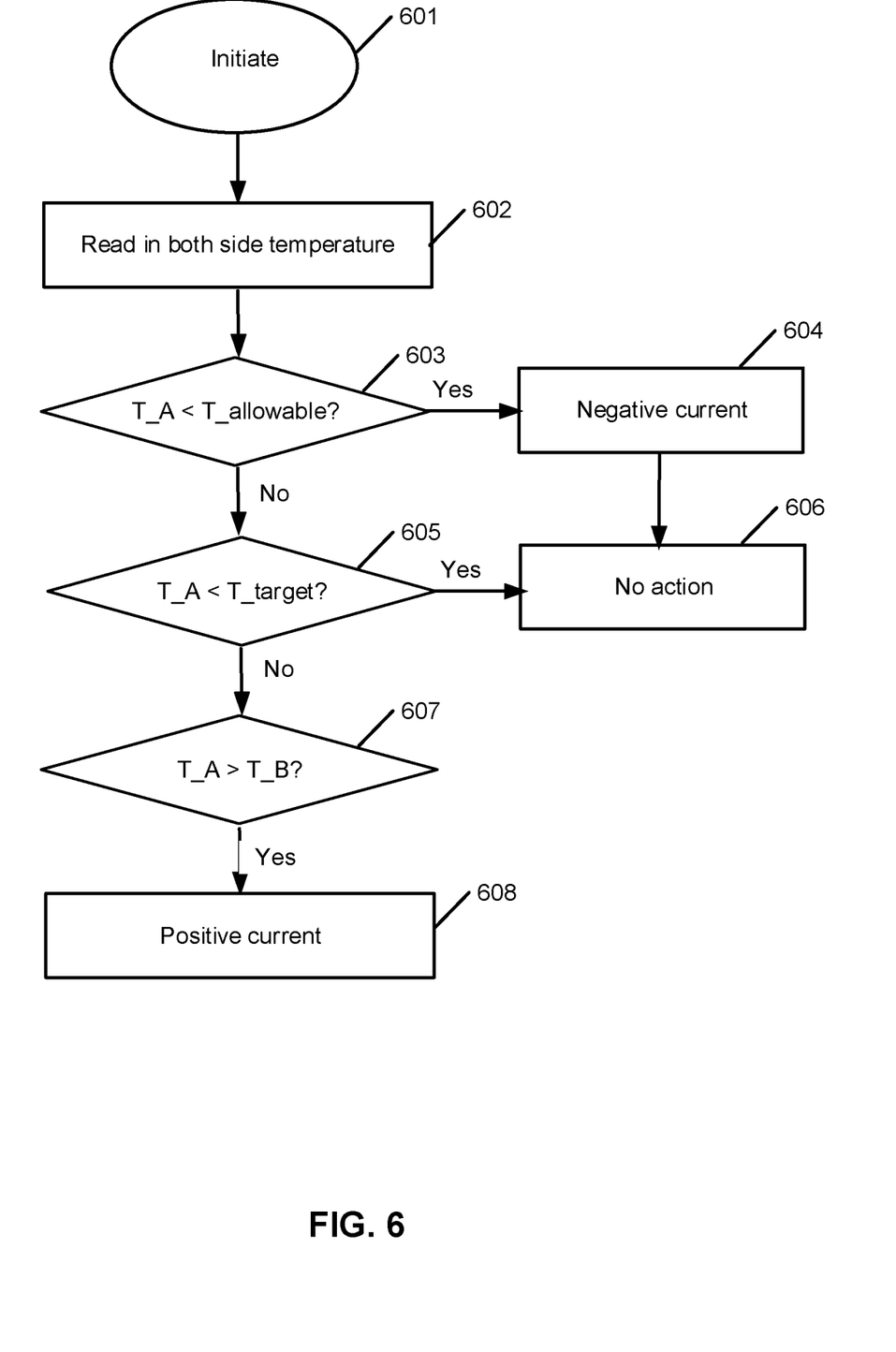
FIG. 6 is a flow diagram of a controller of a cooling and heating system according to some embodiments.

FIG. 6 is a flow diagram 600 of a controller of a cooling and heating system according to some embodiments. The controller may be the controller 106 in the cooling and heating system 100 in FIG. 1. A control logic of the controller is shown in FIG. 6. T_A is a temperature of a first side (side A) of a TEE, which is a side attached to an electronic component or being closer to the electronic component. T_B is a temperature of a second side (side B) of the TEE attached to a heatsink/cold plate or exposed to an ambient environment, where T_B may be an ambient temperature. T_allowable is a minimum allowable temperature for certain electronic components including the electronic component. T_target is a targeted temperature for the certain electronic components including the electronic component.

At block 601, the cooling and heating system may be initiated, by the controller.

At block 602, the temperature of the first side (side A) of the TEE and the temperature of the second side (side B) of the TEE may be read in, by the controller.

At block 603, whether the T_A, the temperature of the first side (side A) of the TEE, is lower than the minimum allowable temperature may be determined by the controller.

At block 604, the controller may determine that the T_A is below the minimum allowable temperature and output a command for a direction of a bidirectional current to heat up the electronic component, for example, a negative current direction. The self-regulated heat transfer controller may be configured to determine a current flow direction of a bidirectional current in the TEE is to be in a direction to heat up the electronic component in response to determining that the temperature of the first side of the thermoelectric element is lower than the minimum temperature allowable for the electronic component. In one embodiment, the direction to heat up the electronic component may be the negative current direction. When the T_A is below the minimum allowable temperature, the current flow may be negative such that TEM is acting as a heat pump, to transfer heat from the ambient environment to the electronic component to heat up the electronic component. In this way, high temperature external heating source is not required to transfer heat to the component to heat up the component, thus, eliminating the need of the external heating source.

At block 605, the controller may determine whether T_A, the temperature of the first side (side A) of the TEE, is lower than T_target, the target temperature.

At block 606, when the T_A is above the minimum allowable temperature, but is below T_target, the target temperature, there is no need to initiate action for heat transfer.

At block 607, in response to determining that T_A, the temperature of the first side (side A) of the TEE, is not lower than T_target, the target temperature, the controller may further determine whether T_A, the temperature of the first side (side A) of the TEE, is higher than T_B, the temperature of the second side (side B) of the TEE.

At block 608, the controller may output a command for a direction of the bidirectional current to cool the electronic component, for example, a positive current direction, in response to determining that T_A, the temperature of the first side (side A) of the TEE, is higher than T_B, the temperature of the second side (side B) of the TEE. In one embodiment, the self-regulated heat transfer controller may be configured to determine the current flow direction of the bidirectional current in the TEE is to be in a direction to cool the electronic component in response to determining that the temperature of the first side of the thermoelectric element is higher than the temperature of the second side of the thermoelectric element.

Figure 7:
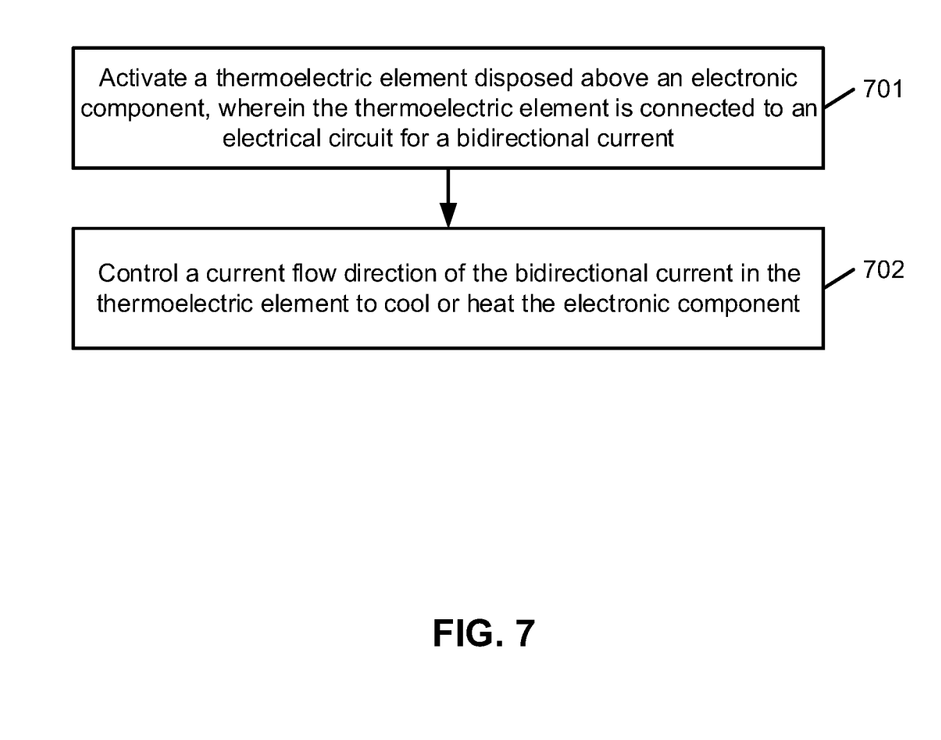
FIG. 7 is a flow diagram illustrating an example of a method for cooling and heating an electronic component according to some embodiments.

FIG. 7 is a flow diagram 700 illustrating an example of a method for cooling and heating an electronic component according to some embodiments. In this method, the electronic component may either be cooled or heated by controlling a current flow direction, without an external heat source, even when active heating may be required. In this way, a self-sensing and self-regulating may be achieved to perform different heat transfer modes within one system. Advantageously, the method may enable an extreme low thermal resistance that traditional cooling method may fail to deliver at a similar efficiency, volume, and cost. The method may be suitable in applications where footprint is limited and compact design is desirable. The method may be used to heat up the electronic components, which makes the method helpful for outdoor applications. The method may be applied to electronic components that have a non-uniform heat gradient, where part of the components may generate much more heat than the other parts. Furthermore, the method is featured with the current flow control to enable the self-regulated heat transfer. Therefore, the method may have a reduced cost and volume and an improved efficiency.

At block 701, a thermoelectric element disposed near an electronic component is activated, where the thermoelectric element is connected to an electrical circuit for a bidirectional current.

At block 702, a current flow direction of the bidirectional current in the thermoelectric element is controlled to cool or heat the electronic component, where whether the electronic component is to be cooled or heated is based on the current flow direction of the bidirectional current in the thermoelectric element.

In one embodiment, the current flow direction of the bidirectional current in the thermoelectric element may be changed by a polarity change circuit.

In one embodiment, a temperature of a first side of the thermoelectric element and a temperature of a second side of the thermoelectric element may be measured, and the current flow direction of the bidirectional current in the thermoelectric element may be determined based on the temperature of the first side of the thermoelectric element and the temperature of the second side of the thermoelectric element.

In one embodiment, the current flow direction of the bidirectional current in the thermoelectric element may be further determined based on a minimum temperature allowed for the electronic component.

In one embodiment, the current flow direction of the bidirectional current in the thermoelectric element may be further determined based on a target temperature for the electronic component.

In one embodiment, the current flow direction of the bidirectional current may be determined to be in a direction to heat up the electronic component in response to determining that a temperature of a first side of the thermoelectric element is lower than a minimum temperature allowed for the electronic component.

In one embodiment, the current flow direction of the bidirectional current may be determined to be in a direction to cool the electronic component in response to determining that a temperature of a first side of the thermoelectric element is higher than a temperature of a second side of the thermoelectric element.

In the foregoing specification, embodiments of the invention have been described with reference to specific exemplary embodiments thereof. It will be evident that various modifications may be made thereto without departing from the broader spirit and scope of the invention as set forth in the following claims. The specification and drawings are, accordingly, to be regarded in an illustrative sense rather than a restrictive sense.

What is claimed is:

1. A cooling and heating system, comprising:
a first thermoelectric element disposed near a first electronic component, the first electronic component including a chip or a memory package, the first thermoelectric element capable of operating in a cooling mode or a heating mode dependent upon a current flow direction of a first electric current flowing therethrough;
a package lid covering the first electronic component, wherein the first thermoelectric element is disposed inside the package lid;
a first polarity change circuit coupled to the first thermoelectric element to switch the current flow direction of the first electric current, the first polarity change circuit including a first plurality of switches;

a first buck-boost converter coupled to a power source, wherein the first buck-boost converter includes a first capacitor, a second capacitor, an inductor, a transistor and a diode, wherein the first capacitor is directly connected to an electromagnetic interference (EMI)/input filter, wherein the second capacitor is directly connected to the first polarity change circuit, and wherein the first polarity change circuit is configured to switch the current flow direction of the first electric current received from an output of the first buck-boost converter;

a second thermoelectric element, disposed near a second electronic component, the second electronic component including one or more non-heavy computing units, the second thermoelectric element capable of operating in a cooling mode or a heating mode dependent upon a current flow direction of a second electric current flowing therethrough, the second electronic component having a second cooling/heating level different than a first cooling/heating level of the first electronic component;

a thermal pad directly attached to the second thermoelectric element for a heat transfer to or from the second electronic component;

a second polarity change circuit coupled to the second thermoelectric element to switch the current flow direction of the second electric current, the second polarity change circuit including a second plurality of switches;

a second buck-boost converter coupled to the power source or another power source, the second buck-boost converter directly connected to the second polarity change circuit, wherein the second polarity change circuit is configured to switch the current flow direction of the second electric current received from an output of the second buck-boost converter; and a controller coupled to the first plurality of switches of the first polarity change circuit to control the current flow direction of the first electric current flowing in the first thermoelectric element and coupled to the second plurality of switches of the second polarity change circuit to control the current flow direction of the second electric current flowing in the second thermoelectric element, wherein the controller is configured to measure a temperature of a first side of the first thermoelectric element and a temperature of a second side of the first thermoelectric element, and to control the current flow direction of the first electric current in the first thermoelectric element based on the temperature of the first side of the first thermoelectric element and the temperature of the second side of the first thermoelectric element.

2. The system of claim 1, further comprising a heat transferring element coupled to the first thermoelectric element, the heat transferring element including a heatsink or a cold plate.

3. The system of claim 1, wherein the first polarity change circuit comprises:

a first switch of the first plurality of switches coupled between a first output terminal of the output of the first buck-boost converter and a first terminal of the first thermoelectric element;

a second switch of the first plurality of switches coupled between the first output terminal of the output of the first buck-boost converter and a second terminal of the first thermoelectric element;

a third switch of the first plurality of switches coupled between a second output terminal of the output of the first buck-boost converter and the second terminal of the first thermoelectric element; and a fourth switch of the first plurality of switches coupled between the second output terminal of the output of the first buck-boost converter and the first terminal of the first thermoelectric element.

4. The system of claim 3, wherein when the first switch and the third switch are turned on while the second switch and fourth switch are turned off, the current flow direction of the first electric current in a first direction, and wherein when the second switch and the fourth switch are turned on while the first switch and the third switch are turned off, the current flow direction of the first electric current is in a second direction opposite to the first direction.

5. The system of claim 1, wherein the controller is further configured to determine:

the current flow direction of the first electric current in the first thermoelectric element based on a minimum temperature allowed for the first electronic component, or the current flow direction of the second electric current in the second thermoelectric element based on a minimum temperature allowed for the second electronic component.

6. The system of claim 1, wherein the controller is further configured to determine:

the current flow direction of the first electric current in the first thermoelectric element based on a target temperature for the first electronic component, or the current flow direction of the second electric current in the second thermoelectric element based on a target temperature for the second electronic component.

7. The system of claim 1, wherein the controller is configured to determine:

the current flow direction of the first electric current to be in a direction to heat up the first electronic component in response to determining that the temperature of the first side of the first thermoelectric element is lower than a minimum temperature allowable for the first electronic component, or the current flow direction of the second electric current to be in a direction to heat up the first electronic component in response to determining that a temperature of the first side of the second thermoelectric element is lower than a minimum temperature allowable for the second electronic component.

8. The system of claim 1, wherein the controller is configured to determine:

the current flow direction of the first electric current to be in a direction to cool the first electronic component in response to determining that the temperature of the first side of the first thermoelectric element is higher than the temperature of the second side of the first thermoelectric element, or the current flow direction of the second electric current to be in a direction to the second electronic component in response to determining that a temperature of the first side of the second thermoelectric element is higher than a temperature of the second side of the second thermoelectric element.

9. The system of claim 1, wherein the system includes the cooling mode of the first thermoelectric element to cool the first electronic component, the cooling mode of the second thermoelectric element to cool the second electronic component, the heating mode of the first thermoelectric element to heat the first electronic component, and the heating mode of the second thermoelectric element to heat the second electronic component, and wherein no extra component is needed when switching between the cooling mode and the heating mode of the first thermoelectric element and no extra component is needed when switching between the cooling mode and the heating mode of the second thermoelectric element.

10. The system of claim 1, wherein the inductor is connected to the transistor and the diode.

11. The system of claim 1, wherein an input of the first buck-boost converter is connected to the EMI/input filter.

12. A method for cooling and heating a first electronic component and a second electronic component, comprising:
activating a first thermoelectric element disposed near the first electronic component, the first electronic component including a chip or a memory package, with a first cooling/heating level, wherein the first thermoelectric element is connected to a first electrical circuit for a first bidirectional current, the first electrical circuit including a first buck-boost converter and a first polarity change circuit, wherein the first thermoelectric element is disposed inside a package lid covering the first electronic component;
switching a current flow direction of the first bidirectional current received from an output of the first buck-boost converter by the first polarity change circuit, wherein the first buck-boost converter is coupled to a power source, wherein the first buck-boost converter includes a first capacitor, a second capacitor, an inductor, a transistor and a diode, wherein the first capacitor is directly connected to an electromagnetic interference (EMI)/input filter, wherein the second capacitor is directly connected to the first polarity change circuit;
measuring a temperature of a first side of the first thermoelectric element and a temperature of a second side of the first thermoelectric element;
determining the current flow direction of the first bidirectional current in the first thermoelectric element based on the temperature of the first side of the first thermoelectric element and the temperature of the second side of the first thermoelectric element;
activating a second thermoelectric element, the second electronic component including one or more non-heavy computing units, the second thermoelectric element capable of operating in a cooling mode or a heating mode dependent upon a current flow direction of a second bidirectional current flowing therethrough, the second electronic component being disposed near a second electronic component with a second cooling/heating level different than the first cooling/heating level of the first electronic component, wherein the second thermoelectric element is connected to a second electrical circuit for the second bidirectional current, the second electrical circuit including a second buck-boost converter and a second polarity change circuit, wherein a thermal pad is directly attached to the second thermoelectric element for a heat transfer to or from the second electronic component;
switching the current flow direction of the second bidirectional current received from an output of the second buck-boost converter by the second polarity change circuit;
measuring a temperature of a first side of the second thermoelectric element and a temperature of a second side of the second thermoelectric element;
determining the current flow direction of the second bidirectional current in the second thermoelectric element based on the temperature of the first side of the second thermoelectric element and the temperature of the second side of the second thermoelectric element; and
controlling the current flow direction of the first bidirectional current in the first thermoelectric element to cool or heat the first electronic component and controlling the current flow direction of the second bidirectional current in the second thermoelectric element to cool or heat the second electronic component, wherein whether the first electronic component is to be cooled or heated is based on the determined current flow direction of the first bidirectional current in the first thermoelectric element, and wherein whether the second electronic component is to be cooled or heated is based on the determined current flow direction of the second bidirectional current in the second thermoelectric element.

13. The method of claim 12, further comprising:
changing the current flow direction of the bidirectional current in the first thermoelectric element by the first polarity change circuit, and
changing the current flow direction of the bidirectional current in the second thermoelectric element by the second polarity change circuit.

14. The method of claim 12, wherein the determining the current flow direction of the first bidirectional current in the first thermoelectric element further comprises determining the current flow direction of the first bidirectional current in the first thermoelectric element further based on a minimum temperature allowed for the first electronic component, and
wherein the determining the current flow direction of the second bidirectional current in the second thermoelectric element further comprises determining the current flow direction of the second bidirectional current in the second thermoelectric element further based on a minimum temperature allowed for the second electronic component.

15. The method of claim 12, wherein the determining the current flow direction of the first bidirectional current in the first thermoelectric element further comprises determining the current flow direction of the first bidirectional current in the first thermoelectric element further based on a target temperature for the first electronic component, and
wherein the determining the current flow direction of the second bidirectional current in the second thermoelectric element further comprises determining the current flow direction of the second bidirectional current in the second thermoelectric element further based on a target temperature for the second electronic component.

16. The method of claim 12, wherein the determining the current flow direction of the first bidirectional current in the first thermoelectric element comprises determining the current flow direction of the first bidirectional current to be in a direction to heat up the first electronic component in response to determining that the temperature of the first side of the first thermoelectric element is lower than a minimum temperature allowed for the first electronic component, and
wherein the determining the current flow direction of the second bidirectional current in the second thermoelectric element comprises determining the current flow direction of the second bidirectional current to be in a direction to heat up the second electronic component in response to determining that the temperature of the first side of the second thermoelectric element is lower than a minimum temperature allowed for the second electronic component.

17. The method of claim 12, wherein the determining the current flow direction of the first bidirectional current in the first thermoelectric element comprises determining the current flow direction of the first bidirectional current to be in a direction to cool the first electronic component in response to determining that the temperature of the first side of the first thermoelectric element is higher than the temperature of the second side of the first thermoelectric element, and wherein the determining the current flow direction of the second bidirectional current in the second thermoelectric element comprises determining the current flow direction of the second bidirectional current to be in a direction to cool the second electronic component in response to determining that the temperature of the first side of the second thermoelectric element is higher than the temperature of the second side of the second thermoelectric element.

18. A cooling and heating system, comprising:
a first thermoelectric element disposed near a first electronic component, the first electronic component including a chip or a memory package, with a first level of cooling/heating, the first thermoelectric element capable of operating in a cooling mode or a heating mode dependent upon a current flow direction of a first electric current flowing therethrough;
a package lid covering the first electronic component, wherein the first thermoelectric element is disposed inside the package lid;
a first polarity change circuit coupled to the first thermoelectric element to switch the current flow direction of the first electric current, the first polarity change circuit including a first plurality of switches;
a first buck-boost converter coupled to a power source, wherein the first buck-boost converter includes a first capacitor, a second capacitor, an inductor, a transistor and a diode, wherein the first capacitor is directly connected to an electromagnetic interference (EMI)/input filter, wherein the second capacitor is directly connected to the first polarity change circuit, and wherein the first polarity change circuit is configured to switch the current flow direction of the electric current received from an output of the first buck-boost converter;
a second thermoelectric element disposed near a second electronic component, the second electronic component including one or more non-heavy computing units, the second thermoelectric element capable of operating in a cooling mode or a heating mode dependent upon a current flow direction of a second electric current flowing therethrough, the second electronic component having a second cooling/heating level different than the first cooling/heating level of the first electronic component;
a thermal pad directly attached to the second thermoelectric element for a heat transfer to or from the second electronic component;
a second polarity change circuit coupled to the second thermoelectric element to switch the current flow direction of the second electric current, the second polarity change circuit including a second plurality of switches;
a second buck-boost converter coupled to the power source or another power source, the second buck-boost converter directly connected to the second polarity change circuit, wherein the second polarity change circuit is configured to switch the current flow direction of the second electric current received from an output of the second buck-boost converter; and
a controller coupled to the first plurality of switches of the first polarity change circuit to control the current flow direction of the first electric current flowing in the first thermoelectric element and coupled to the second plurality of switches of the second polarity change circuit to control the current flow direction of the second electric current flowing in the second thermoelectric element.

19. The system of claim 18, wherein the inductor is connected to the transistor and the diode.

* * * * *